(12) United States Patent  
Youn

(10) Patent No.: US 8,730,733 B2
(45) Date of Patent: May 20, 2014

(54) NON-VOLATILE MEMORY DEVICE AND MEMORY SYSTEM INCLUDING THE SAME

(75) Inventor: Tae Un Youn, Cheongju-si (KR)

(73) Assignee: SK Hynix Inc., Gyeonggi-do (KR)

(*) Notice: Subject to any disclaimer, the term of this patent is extended or adjusted under 35 U.S.C. 154(b) by 142 days.

(21) Appl. No.: 13/406,174

(22) Filed: Feb. 27, 2012

(65) Prior Publication Data

US 2012/0218850 A1 Aug. 30, 2012

(30) Foreign Application Priority Data

Feb. 28, 2011 (KR) .................. 10-2011-0017786

(51) Int. Cl.
*G11C 16/04* (2006.01)

(52) U.S. Cl.
USPC ............. 365/185.18; 365/185.17; 365/189.09

(58) Field of Classification Search
USPC ............. 365/185.17, 185.18, 185.19, 185.23, 365/189.09
See application file for complete search history.

(56) References Cited

U.S. PATENT DOCUMENTS

| | | | | |
|---|---|---|---|---|
| 7,619,930 B2 * | 11/2009 | Mokhlesi | ................. | 365/185.22 |
| 7,889,560 B2 * | 2/2011 | Guterman | ................. | 365/185.18 |
| 8,125,832 B2 * | 2/2012 | Mokhlesi | ................. | 365/185.22 |
| 8,456,918 B2 * | 6/2013 | Oh et al. | .................. | 365/185.23 |
| 2009/0257280 A1 * | 10/2009 | Oh et al. | .................. | 365/185.19 |

FOREIGN PATENT DOCUMENTS

KR 1020090100077 A 9/2009

* cited by examiner

*Primary Examiner* — Gene Auduong
(74) *Attorney, Agent, or Firm* — William Park & Associates Patent Ltd.

(57) ABSTRACT

A non-volatile memory device and a read method thereof are disclosed. The read method includes providing a memory block having memory cells connected to word lines and connected in serial to a bit line, sensing potential of the bit line by applying a first read voltage to a selected word line of the word lines and providing a first pass voltage to an unselected word line adjacent to the selected word line, sensing potential of the bit line by applying a second read voltage higher than the first read voltage to the selected word line and providing a second pass voltage lower than the first pass voltage to the unselected word line adjacent to the selected word line, and sensing potential of the bit line by applying a third read voltage higher than the second read voltage to the selected word line and providing a third pass voltage lower than the second pass voltage to the unselected word line adjacent to the selected word line.

18 Claims, 3 Drawing Sheets

NON-VOLATILE MEMORY DEVICE AND MEMORY SYSTEM INCLUDING THE SAME

CROSS-REFERENCE TO RELATED APPLICATIONS

This application claims priority from Korean Patent Application No. 10-2011-0017786, filed on Feb. 28, 2011, the contents of which are incorporated by reference in its entirety.

BACKGROUND OF THE INVENTION

The present invention relates generally to a non-volatile memory device and a memory system including the same, and more particularly relates to a non-volatile memory device for reading data by sensing accurately threshold voltage of a selected memory cell in a read operation and a memory system including the same.

Recently, demand has increased for non-volatile memory device, which does not require a refresh function of periodically rewriting data, and which allows electrical programming and erasing of data.

The non-volatile memory device performs a read operation by sensing voltage of a bit line after applying a read voltage to selected word line and providing a pass voltage to an unselected word line. The threshold voltage of memory cells connected to the unselected word line that is adjacent to the selected word line increases due to coupling effect of the read voltage applied to the selected word line. As a result, resistance of the memory cells connected to the unselected word line increases, and the threshold voltage of the selected memory cell increases. Accordingly, erroneous data may be read in the read operation.

In addition, a multilevel cell has many states, and the highest threshold voltage value of the uppermost threshold voltage distribution of threshold voltages for determining state of a memory cell increases gradually. Accordingly, the pass voltage applied to the memory cells not selected should be increased. However, when the pass voltage increases, a read disturbance phenomenon may occur as voltage difference between a gate of the memory cell and a substrate augments in the read operation.

SUMMARY OF THE INVENTION

It is a feature of the present invention to provide a non-volatile memory device for sensing accurately threshold voltage of a memory cell connected to a selected word line by applying a pass voltage changed in accordance with a read voltage provided to the selected word line to word lines adjacent to the selected word line in a read operation and outputting data corresponding to the sensed threshold voltage, and a memory system including the same.

A non-volatile memory device according to one embodiment of the present invention includes a memory block configured to have memory cells connected to word lines; and a power supplying section configured to generate read voltages applied in sequence to a selected word line of the word lines, and generate a first pass voltage provided to an unselected word line adjacent to the selected word line. The potential of the first pass voltage may change in accordance with the read voltages.

A non-volatile memory device according to another embodiment of the present invention includes a memory block configured to have memory cells connected to word lines; and a power supplying section configured to apply variable read voltage to a selected word line of the word lines, provide variable pass voltage to two unselected word lines adjacent to the selected word line, and apply constant pass voltage to the unselected word lines that are not adjacent to the selected word line. The power supplying section generates the variable read voltage including a first read voltage, a second read voltage higher than the first read voltage, and a third read voltage higher than the second read voltage. The power supplying section also generates the variable pass voltage having a first pass voltage corresponding to the first read voltage, a second pass voltage corresponding to the second read voltage and lower than the first pass voltage, and a third pass voltage corresponding to the third read voltage and lower than the second pass voltage.

A memory system according to one embodiment of the present invention includes a non-volatile memory device configured to have a memory block including memory cells connected to word lines and a power supplying section for supplying read voltages whose potential increases in sequence to a selected word line of the word lines, and supplying a first pass voltage whose potential decreases in sequence in accordance with the read voltages to an unselected word line adjacent to the selected word line; and a memory controller configured to control the non-volatile memory device in a program operation, an erase operation, or a read operation.

A non-volatile memory device of the present invention applies a pass voltage changed in accordance with a read voltage provided to a selected word line to word lines adjacent to the selected word line in its read operation, thereby sensing accurately threshold voltage of a memory cell connected to the selected word line and outputting data corresponding to the sensed threshold voltage.

BRIEF DESCRIPTION OF THE DRAWINGS

The features and advantages of the present invention will become readily apparent by reference to the following detailed description when considered in conjunction with the accompanying drawings.

DESCRIPTION OF SPECIFIC EMBODIMENTS

Various embodiments of the present invention will be explained in more detail with reference to the accompanying drawings. Although the invention is described with reference to a number of illustrative embodiments, it should be understood that numerous other modifications and embodiments can be devised by those skilled in the art that will fall within the spirit and scope of the principles of this disclosure.

Figure 1:
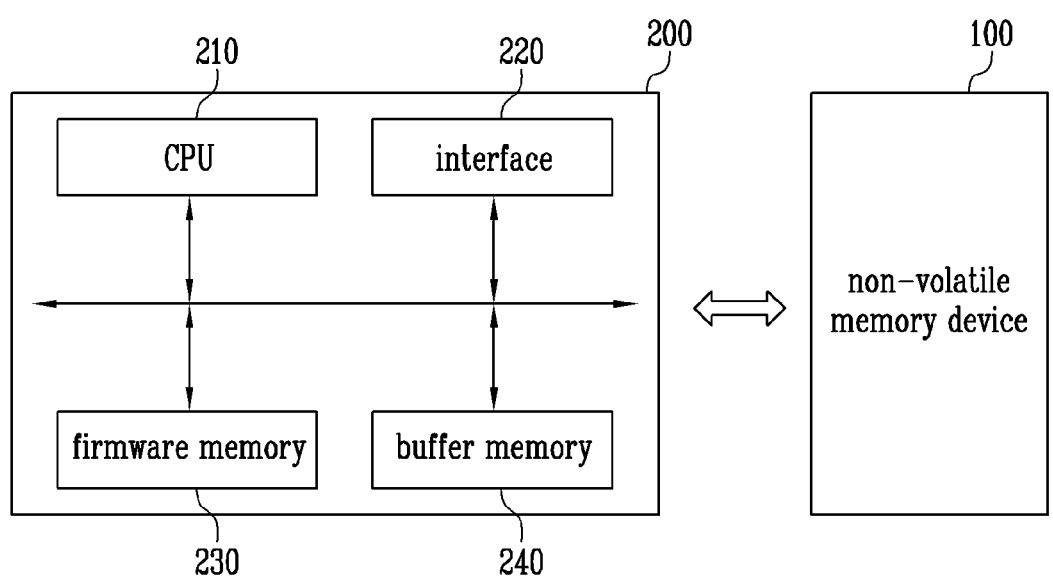
FIG. 1 is a block diagram illustrating a memory system according to one example embodiment of the present invention.

FIG. 1 is a block diagram illustrating a memory system according to one example embodiment of the present invention. In FIG. 1, the memory system of the present embodiment includes a non-volatile memory device 100 and a memory controller 200. The memory controller 200 interfaces with an external device through various interface methods that are design and/or implementation dependent. The non-volatile memory device 100 performs a program operation, an erase operation, and a read operation under control of the memory controller 200.

The memory controller 200 controls the non-volatile memory device 100 in response to command transmitted by an external device such as, for example, a host computer (not shown). The memory controller 200 may include a CPU 210, an interface 220, a firmware memory 230 for storing firmware, and a buffer memory 240.

When a command is inputted from the external device, the CPU 210 controls operation corresponding to the inputted command in accordance with the firmware stored in the firmware memory 230. The firmware stored in the firmware memory 230 may include, for example, a flash translation layer FTL, and the FTL has an address mapping function, a bad block management function, a power fail recovery function, and a data backup function for preventing loss of lower data.

The buffer memory 240 stores temporarily data to be stored in the non-volatile memory device 100 or data read from the non-volatile memory device 100.

The interface 220 communicates address and/or data, including read/program/erase commands, between the memory controller 200 and the non-volatile memory device 100.

Figure 2:
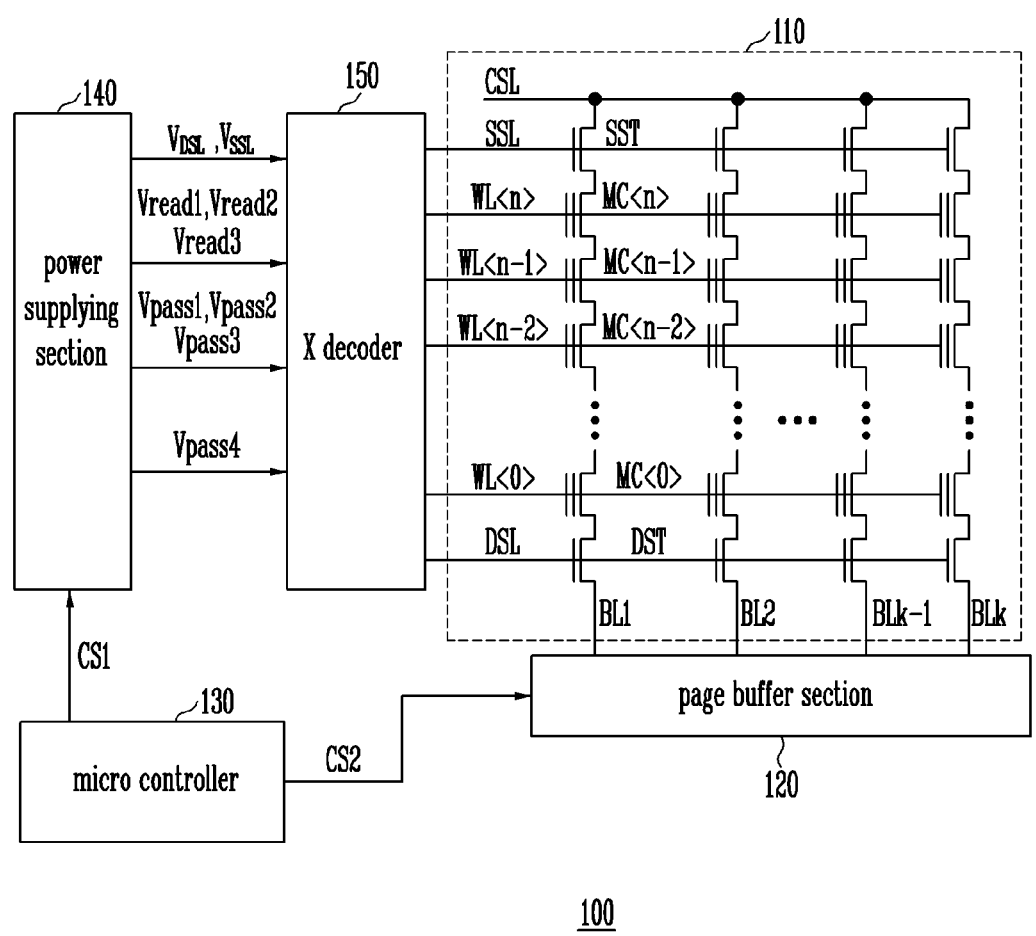
FIG. 2 is a block diagram illustrating a non-volatile memory device according to one example embodiment of the present invention.

FIG. 2 is a block diagram illustrating a non-volatile memory device according to one example embodiment of the present invention.

In FIG. 2, the non-volatile memory device 100 includes a memory block 110, a page buffer section 120, a micro controller 130, a power supplying section 140, and an X decoder 150.

The memory block 110 includes a drain select transistor DST, memory cells MC<0> to MC<n>, and a source select transistor SST connected in serial between each of bit lines BL1 to BLk and a common source line CSL. The memory cells MC<0> to MC<n> are connected to the word lines WL<0> to WL<n>.

The page buffer section 120 is connected to the bit lines BL1 to BLk of the memory block 110. The page buffer section 120 senses potential of the bit lines BL1 to BLk in the read operation of the non-volatile memory device 100, and outputs read data corresponding to the sensed potential to an external device.

The micro controller 130 outputs a power supplying section control signal CS1 for controlling the power supplying section 140 in the read operation of the non-volatile memory device 100. The micro controller 130 also outputs a page buffer control signal CS2 for controlling the page buffer section 120 in the read operation of the non-volatile memory device 100.

The power supplying section 140 generates a drain select line voltage $V_{DSL}$ and a source select line voltage $V_{SSL}$ for the drain select line DSL and the source select line SSL, respectively, in response to the power supplying section control signal CS1. The power supplying section 140 also generates a first to a third read voltages Vread1, Vread2, and Vread3 that are provided in sequence to a selected word line; a first to a third pass voltages Vpass1, Vpass2, and Vpass3 that are applied to the unselected word line(s) adjacent to the selected word line; and a fourth pass voltage Vpass4 applied to the unselected word lines that are not adjacent to the selected word line. An unselected word line that is adjacent to the selected word line may be referred to as an unselected adjacent word line.

In another embodiment of the present invention, the power supplying section 140 may provide the first to the third pass voltages Vpass1, Vpass2, and Vpass3 to only an unselected adjacent word line closest to the drain select line DSL, or to only an unselected adjacent word line closest to the source select line SSL, and apply the fourth pass voltage Vpass4 to the other unselected adjacent word line.

Potential of the first read voltage Vread1 is lower than that of the second read voltage Vread2, and potential of the second read voltage Vread2 is lower than that of the third read voltage Vread3. Potential of the first pass voltage Vpass1 is higher than that of the second pass voltage Vpass2, and potential of the second pass voltage Vpass2 is higher than that of the third pass voltage Vpass3. The potential of the fourth pass voltage Vpass4 may be the same as or lower than that of the third pass voltage Vpass3.

The X decoder 150 applies the drain select line voltage $V_{DSL}$ and the source select line voltage $V_{SSL}$ generated by the power supplying section 140 to the drain select line DSL and the source select line SSL, respectively, of the memory block 110 in the read operation of the non-volatile memory device 100. The X decoder 150 applies the first pass voltage Vpass1 to the two unselected adjacent word lines, WL<n-2> and WL<n> adjacent to the selected word line WL<n-1> when the first red voltage Vread1 is applied to the selected word line. In addition, the X decoder 150 applies the second pass voltage Vpass2 to the two unselected adjacent word lines WL<n-2> and WL<n> adjacent to the selected word line WL<n-1> when the second read voltage Vread1 is applied to the selected word line WL<n-1>, and applies the third pass voltage Vpass3 to the two unselected adjacent word lines WL<n-2> and WL<n> adjacent to the selected word line WL<n-1> when the third read voltage Vread3 is applied to the selected word line WL<n-1>. When the first to the third read voltages Vread1 to Vread3 are applied, the fourth pass voltage Vpass4 is provided to the other unselected word lines that are not adjacent to the selected word line WL<n-1>.

Figure 3:
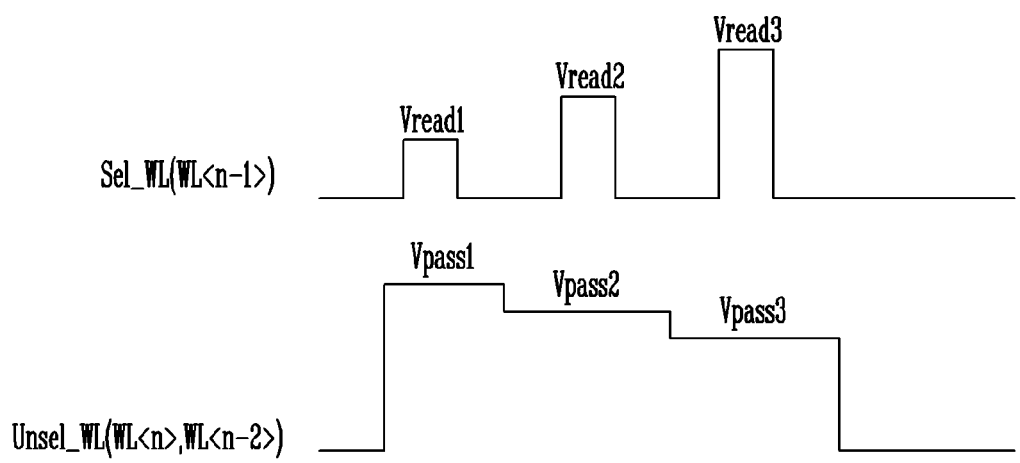
FIG. 3 is an exemplary waveform of a voltage of a word line in a read operation of a non-volatile memory device according to one example embodiment of the present invention.

FIG. 3 is a waveform of a voltage of a word line in a read operation of a non-volatile memory device according to one example embodiment of the present invention.

A method of reading data in the non-volatile memory device will be described in detail with reference to drawings FIG. 2 and FIG. 3.

The micro controller 130 outputs the power supplying section control signal CS1 for controlling the power supplying section 140 and the page buffer control signal CS2 for controlling the page buffer section 120.

The page buffer section 120 precharges the bit lines BL1 to BLk of the memory block 110 to high level in response to the page buffer control signal CS2.

The power supplying section 140 generates the drain select line voltage $V_{DSL}$, the source select line voltage $V_{SSL}$, the first read voltage Vread1 applied to the selected word line, e.g. WL<n-1>, the first pass voltage Vpass1 provided to the two unselected adjacent word lines WL<n-2> and WL<n> adjacent to the selected word line WL<n-1>, and the fourth pass voltage Vpass4 applied to the other unselected word lines not adjacent to the selected word line WL<n-1> in response to the control signal CS1.

The X decoder 150 respectively applies the drain select line voltage $V_{DSL}$, the source select line voltage $V_{SSL}$, the first read voltage Vread1, the first pass voltage Vpass1, and the fourth pass voltage Vpass4 outputted from the power supplying section 140 to the drain select line DSL, the source select line SSL, and the word lines WL<0> to WL<n> of the memory block 110.

The memory cell MC<n-1> connected to the selected word line WL<n-1> is turned off if the threshold voltage value of the memory cell MC<n-1> is higher than the first read voltage Vread1, and is turned on if the threshold voltage value is smaller than the first read voltage Vread1. Accordingly, when a memory cell is turned off, the potential of the bit line connected to the memory cell maintains a high level. When a memory cell is turned on, the potential of the bit line connected to the memory cell is discharged to a low level. In this case, the memory cells MC<0> to MC<n−2> and MC<n> connected to the unselected word lines WL<0> to WL<n−2> and WL<n> are turned on by the first pass voltage Vpass1 and the fourth pass voltage Vpass4.

The page buffer section 120 senses the potential of the bit lines BL1 to BLk, and outputs the read data corresponding to the sensed potential to the external device.

Subsequently, the power supplying section 140 generates and outputs the second read voltage Vread2 in response to the control signal CS1, and also generates and outputs the second pass voltage Vpass2.

Accordingly, the second read voltage Vread2 is applied to the selected word line WL<n−1>, and the second pass voltage Vpass2 is provided to the unselected adjacent word lines WL<n−2> and WL<n> adjacent to the selected word line WL<n−1>. Since the second read voltage Vread2 higher than the first read voltage Vread1 is applied to the selected word line WL<n−1>, potential of a floating gate of the memory cells MC<n−2> and MC<n> connected to the unselected adjacent word lines WL<n−2> and WL<n> increases due to capacitance effect, and so the threshold voltage value of the memory cells MC<n−2> and MC<n> augments. As a result, resistance of the unselected adjacent word lines WL<n−2> and WL<n> increases, and so the threshold voltage value of the selected memory cell MC<n−1> may be sensed as a value higher than its real value. To compensate for the threshold voltage value, the second pass voltage Vpass2 smaller than the first pass voltage Vpass1 is applied to the unselected adjacent word lines WL<n−2> and WL<n>. As a result, the threshold voltage values of the memory cells MC<n−2> and MC<n> connected to the unselected adjacent word lines WL<n−2> and WL<n> does not change. Accordingly, the threshold voltage value of the selected memory cell MC<n−1> may be sensed accurately.

Then, the power supplying section 140 generates and outputs the third read voltage Vread3 in response to the power supplying section control signal CS1, and generates and outputs the third pass voltage Vpass3. The potential of the third read voltage Vread3 is lower than that of the third pass voltage Vpass3.

Accordingly, the third read voltage Vread3 is applied to the selected word line WL<n−1>, and the third pass voltage Vpass3 is provided to the unselected adjacent word lines WL<n−2> and WL<n> adjacent to the selected word line WL<n−1>. Since the third read voltage Vread3 higher than the second read voltage Vread2 is provided to the selected word line WL<n−1>, a potential of a floating gate of the memory cells MC<n−2> and MC<n> connected to the unselected adjacent word lines WL<n−2> and WL<n> increases due to capacitance effect, and so the threshold voltage value augments. As a result, resistance of the unselected adjacent word lines WL<n−2> and WL<n> increases and so the threshold voltage value of the selected memory cell MC<n−1> may be sensed as a value higher than its real value. To compensate for the threshold voltage value, the third pass voltage Vpass3 smaller than the second pass voltage Vpass2 is applied to the unselected adjacent word lines WL<n−2> and WL<n>. As a result, the threshold voltage values of the memory cells MC<n−2> and MC<n> connected to the unselected adjacent word lines WL<n−2> and WL<n> does not change. Accordingly, the threshold voltage value of the selected memory cell MC<n−1> may be sensed accurately.

In the above embodiments, the first to the third pass voltages Vpass1, Vpass2 and Vpass3 are applied to the two unselected adjacent word lines adjacent to the selected word line. In another embodiment of the present invention, the first to the third pass voltages Vpass1, Vpass2 and Vpass3 may be provided to only the unselected adjacent word line closest to the drain select line or to only the unselected adjacent word line closest to the source select line, and the fourth pass voltage Vpass4 may be applied to the other unselected adjacent word line.

Although embodiments have been described with reference to a number of illustrative embodiments thereof, it should be understood that numerous other modifications and embodiments can be devised by those skilled in the art that will fall within the spirit and scope of the principles of this disclosure. That is, the read operation of the non-volatile memory device including the multilevel cell having fourth threshold voltage distributions erase state, PV1, PV2 and PV3 is described in the above description, but the read operation of the non-volatile memory device is not limited to the above description. For example, the read operation may be also applied to the non-volatile memory device including a triple level cell having eight threshold voltage distributions.

What is claimed is:

1. A non-volatile memory device comprising:
a memory block configured to have memory cells connected to word lines; and
a power supplying section configured to generate read voltages applied in sequence to a selected word line of the word lines, and generate a first pass voltage provided to an unselected word line adjacent to the selected word line during a read operation,
wherein potential of the first pass voltage changes in accordance with the read voltages.

2. The non-volatile memory device of claim 1, wherein the read voltages are generated in sequence in order from the read voltage having low potential level to the read voltage having high potential level, and are provided to the memory block.

3. The non-volatile memory device of claim 2, wherein potential of the first pass voltage decreases as potential of the read voltages increases.

4. The non-volatile memory device of claim 3, wherein the power supplying section generates a second pass voltage having a potential at most the same level as lowest potential level of the first pass voltage, and provides the generated second pass voltage to the unselected word lines that are not adjacent to the selected word line.

5. The non-volatile memory device of claim 3, wherein the read voltage having highest potential of the read voltages is lower than lowest potential of the first pass voltage.

6. The non-volatile memory device of claim 1, wherein the unselected word line adjacent to the selected word line is includes both unselected word lines adjacent to the selected word line.

7. The non-volatile memory device of claim 1, wherein the unselected word line adjacent to the selected word line is a word line adjacent to the selected word line in the direction of a source select transistor.

8. The non-volatile memory device of claim 1, wherein the unselected word line adjacent to the selected word line is a word line adjacent to the selected word line in the direction of a drain select transistor.

9. A non-volatile memory device comprising:
a memory block configured to have memory cells connected to word lines; and a power supplying section configured to apply a variable read voltage to a selected word line, provide variable pass voltage to two unselected word lines that are adjacent to the selected word line, and apply constant pass voltage to the unselected word lines that are not adjacent to the selected word line during a read operation, wherein the power supplying section generates the variable read voltage including a first read voltage, a second read voltage higher than the first read voltage, a third read voltage higher than the second read voltage, and the variable pass voltage having a first pass voltage corresponding to the first read voltage, a second pass voltage corresponding to the second read voltage and lower than the first pass voltage, and a third pass voltage corresponding to the third read voltage and lower than the second pass voltage.

10. The non-volatile memory device of claim 9, wherein potential of the third pass voltage is at least that of the constant pass voltage.

11. The non-volatile memory device of claim 9, wherein potential of the variable read voltage is lower than that of the constant pass voltage.

12. The non-volatile memory device of claim 9, wherein potential of the first read voltage is lower than that of the third pass voltage.

13. A memory system comprising:
a non-volatile memory device configured to have a memory block including memory cells connected to word lines and a power supplying section for supplying read voltages whose potential increases in sequence to a selected word line of the word lines, and a first pass voltage whose potential decreases in sequence in accordance with the read voltages to an unselected word line adjacent to the selected word line during a read operation; and
a memory controller configured to control the non-volatile memory device in a program operation, an erase operation, or a read operation.

14. The memory system of claim 13, wherein a highest potential for a read voltage is smaller than lowest potential of the first pass voltage.

15. The memory system of claim 13, wherein potential of a second pass voltage applied to the unselected word lines that are not adjacent to the selected word line is the same as or lower than that of the first pass voltage.

16. The memory system of claim 13, wherein the unselected word line adjacent to the selected word line includes both a word line adjacent to the selected word line in the direction of a source select transistor and a word line adjacent to the selected word line in the direction of a drain select transistor.

17. The memory system of claim 13, wherein the unselected word line adjacent to the selected word line is a word line adjacent to the selected word line in the direction of a source select transistor.

18. The memory system of claim 13, wherein the unselected word line adjacent to the selected word line is a word line adjacent to the selected word line in the direction of a drain select transistor.

* * * * *